June 22, 1965 C. C. IH 3,191,064
HIGH SPEED SWITCHING CIRCUIT
Filed Aug. 22, 1962
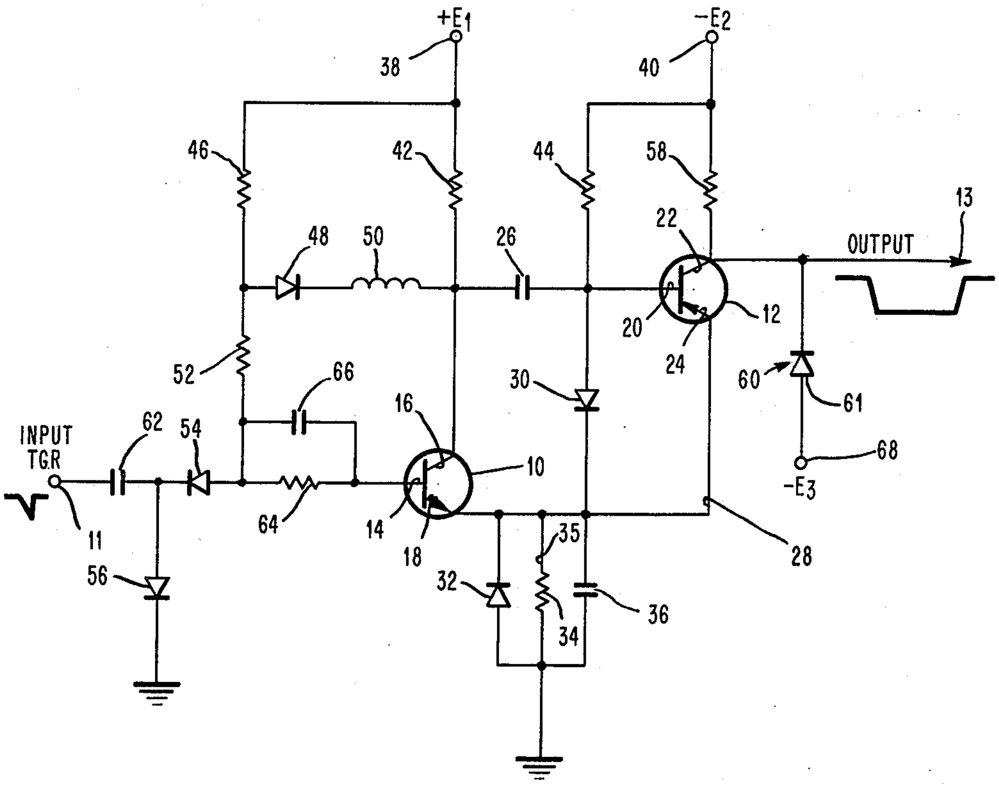
INVENTOR
CHARLES C. IH
BY Rene A. Kuypers
ATTORNEY United States Patent Office 3,191,064

Patented June 22, 1965

3,191,064

HIGH SPEED SWITCHING CIRCUIT

Charles C. Ih, Philadelphia, Pa., assignor to Sperry Rand Corporation, New York, N.Y., a corporation of Delaware Filed Aug. 22, 1962, Ser. No. 218,602
7 Claims. (Cl. 307—88.5)

This invention relates to a group of circuits known in the art as switching circuits and in particular to monostable multivibrators.

Heretofore, a salient disadvantage of known prior art monostable multivibrator circuits has been the relatively slow switching speeds with which these devices have operated upon the application of an input trigger signal. Newly developed high speed computers require switching speeds operating in the nanosecond region. Such high speed switching is not readily available with presently known monostable multivibrators.

Another shortcoming of these prior art circuits is that they lack sensitivity which results from the fact that inherent delays occur in developing the output signal. For instance if a prior art complementary transistor circuit is considered wherein both stages are normally conducting, an input trigger signal causes, first, the input stage to be "turned-off," which in turn causes the "turn-off" of the output stage. In order, however, to keep the input stage "turned-off," a signal from the output stage must be fed-back to the input stage. It requires time to "turn-off" a stage and hence each "turn-off" operation represents a delay. These delays limit the sensitivity of the circuit, i.e. to receive and respond to narrow input pulses that are present in new, high speed circuit applications. In view of the fact that prior art circuits have limited sensitivity, they are also unable to produce narrow output pulses from long duration input pulses.

It is, therefore, an object of this invention to provide a new high speed switching circuit which is characterized by switching speeds in the nanosecond region.

It is a further object of the present invention to provide an improved solid state electronic switch.

It is a further object of the present invention to provide a relatively high speed monostable multivibrator circuit.

It is still a further object of the present invention to provide a switching circuit which will be sensitive to narrow input pulses and is also capable of generating narrow output pulses.

In accordance with a feature of this invention there is provided a feedback signal means coupled directly across the output and input terminals of a first stage or input stage current conducting device. This arrangement is the basis for improved sensitivity since it enables the input stage current conducting device to be controlled within its own stage and independently of the output stage.

In accordance with another feature of the instant invention, there is provided a current source means coupled to the input electrode of the first stage current conducting device and to the control electrode of the second stage current conducting device. The current source means provides "turn-off" current to the second stage current conducting device to effect a fast fall time of the output signal. Further, the current source means delays the provision of quiecent state current to the first stage current conducting device, which effects a rapid discharge of circuit capacitance and therefore a rapid restoration to its quiescent state.

The novel features that are considered characteristic of this invention are set forth with particularity in the appended claims. The invention itself, however, both as to its organization and method of operation, as well as additional objects and advantages thereof, will best be understood from the following description when considered in connection with the accompanying drawing, in which a schematic of a switching circuit utilizing a pair of complementary transistors and embodying the invention is depicted.

In carrying out the invention there is provided an input or first stage transistor whose collector electrode is coupled through a capacitor to the base electrode of a second or output transistor.

Connected intermediate the capacitor and base electrode of the output stage transistor is the anode of a diode whose cathode is connected to a common connection between the emitters of the two transistors. Also connected between the base and collector electrode of the input stage transistor is a circuit in which an inductor is one of the components. The input and output stage transistors are normally conducting.

Upon the application of a negative trigger pulse to the base of the input stage transistor, it immediately stops conducting. The inductor which provides a circuit path for current to the input stage transistor does not immediately stop conducting in response to the negative trigger pulse and hence, acts as a current source. The current supplied by the inductor is transmitted through a capacitor into the base electrode of the output stage transistor, thereby causing it to be "turned-off." This current which passes through the capacitor and into the base electrode acts as a surge or transient pulse which quickly neutralizes stored minority carriers in the output stage transistor and thereby causes a fast fall time in the output signal. Simultaneously with this occurrence the above-mentioned capacitor, which was discharged when the input and output stage transistors were conducting, begins to assume a charge through appropriately connected potential sources.

Concurrently, the charging current for the capacitor also flows through the diode connected between the capacitor and base electrode of the output stage transistor, as well as through a resistor. One terminal of the resistor is connected to the circuit joining the emitters of the input and output stage transistors, and the second terminal is connected to ground potential. This last-mentioned current flow provides a direct feedback signal from the collector of the input stage transistor to its emitter thereby keeping the input transistor "turned-off." By this expedient, the input stage transistor is controlled independently of the output stage transistor, hereby materially increasing the circuit sensitivity.

After the capacitor charging current is reduced below a certain value, the voltage drop across the resistor in the input emitter circuit decreases. The potential at the emitter falls below the voltage at the base electrode, thereby causing the first stage to become forward biased and hence it begins to conduct.

In response to the input stage being turned-on, the voltage developed on the capacitor is applied between the base and the emitter of the output stage transistor. Immediately thereupon, the capacitor discharges quickly through a low impedance path provided by the input and output transistors. The inductor enables the discharge current to be quickly withdrawn from the capacitor through the first transistor because of its inability to immediately resume current conduction. As soon as the capacitor discharges, the circuit is returned to its quiescent state.

Referring now to the drawing, the switching circuit includes in accordance with the invention and by way of example only, a pair of transistors 10 and 12 of opposite conductivity wherein input transistor 10 may be considered of the NPN type and transistor 12 of the PNP type. It is understood of course that such an arrangement may be reversed by proper biasing. Also, other type solid state devices could be utilized in the circuit without detracting from the spirit of the invention. Associated with each transistor are base, collector and emitter electrodes. Thus, the transistor 10 includes a base 14, a collector 16, and an emitter 18. Transistor 12 similarly includes a base 20, a collector 22, and an emitter 24.

The two transistors 10 and 12 are coupled to each other by a capacitor 26, one terminal of which is connected to electrode 16 of the input stage transistor 10 and the second terminal of which is connected to the base 20 of the output stage transistor 12. The two transistors are also coupled through their respective emitters 18 and 24 by a circuit connection 28. Connected intermediate capacitor 26 and the base 20 of transistor 12 is the anode of a diode 30. The cathode of diode 30 is connected to the circuit connection 28. Associated with diode 30 and cooperating therewith are the diode 32, the resistor 34, and capacitor 36 which are connected between the circuit connection 28 and ground potential.

Transistors 10 and 12 are normally conductive and therefore the emitter and base junctions of each are biased in the forward direction. When transistors 10 and 12 are conducting which is considered the quiescent state, capacitor 26 is discharged and current flow in the circuit is from potential source 38, through resistor 42, through transistor 10, and through the base 20 of transistor 12, through the resistor 44 to a second source of potential 40. A current loop is also established in the quiescent state through the same components as mentioned above excluding the base 20 but including resistor 58. Concurrently, there is current flow from ground potential through both diode 32 and resistor 34, through transistor 12 to potential source 40.

There is another current loop established from source 38, through resistor 46, through diode 48, through inductance 50, through transistors 10 and 12 to potential source 40. Simultaneously with this loop, current flows from source 38, through resistors 46, 52 and 64 to the base 14 of the transistor 10. These two last-mentioned current loops provide a voltage drop across the collector 16 and base 14. This voltage drop maintains transistor 10 in the non-saturated state. As is well known, saturation is to be avoided in switching circuits because of its effect on transient response.

After a negative input trigger signal has been applied to terminal 11 and transistor 10 is "turned-off," there is current flow from source 38, through resistors 46 and 52, through diodes 54 and 56 to ground. This current flow provides a small positive voltage which is applied through resistor 64 to the base electrode 14. Diode 56 also provides D.C. restoration to the input trigger circuit since it enables capacitor 62 to be discharged to ground after it has been charged to a negative voltage by the negative input trigger signal.

In operation, a negative pulse signal is transmitted to the input terminal 11 through the coupling capacitor 62 to the base 14 of the input transistor 10, and immediately transistor 10 stops conducting. This is caused by the fact that the input pulse causes the base 14 to become negative with respect to the emitter 18 and thereby reverses biased. As before-mentioned, the voltage drop across the collector-base junction of transistor 10 maintains the latter in the non-saturated state and this condition enables current conduction in the transistor to be quickly terminated. When the first stage transistor 10 stops conducting, the lower terminal of resistor 42 rises to a high potential which is applied through the capacitor 26 to the base 20 of transistor 12. This signal causes the emitter-base junction of the output transistor 12 to become reverse biased. As hereinafter described, transistor 12 quickly stops conducting in response to both the application of the positive voltage applied to base 20 as the potential on collector 16 rises, as well as the "turn-off" current from inductor 50. The "turn-off" current flowing into the base 20 acts as a surge or transient pulse and helps to neutralize the stored minority carriers in transistor 12, thereby providing quick "turn-off."

As soon as transistor 10 and transistor 12 stop conducting because of the application of the negative trigger signal to the base 14, current from potential source 38 stops flowing through transistors 10 and 12 and instead it begins flowing through capacitor 26, through resistor 44, to potential source 40. Charging current also is conducted from potential source 38, through capacitor 26, through diode 30, through resistor 34 to ground potential. This feature is an important aspect of the circuit operation since by reversing the current flow through resistor 34, a positive potential is developed at point 35 which renders diode 32 reverse biased and which causes the transistor 10 to remain cut-off since its base-emitter junction is reverse biased. In effect, the positive signal at collector 16 is fed back to the emitter 18 which keeps transistor 10 "turned-off." Since transistor 10 is controlled independently of transistor 12, there is no delay in transferring the control signal from one stage to another in order to render the first stage non-conductive. This direct feedback action results in greater sensitivity since the circuit is able to receive extremely narrow input trigger signals. The increased circuit sensitivity of the present invention also enables it to provide narrow output pulses from long duration input pulses, as will be more fully explained.

Ordinarily the trigger signal to an input stage of a monostable multivibrator (if a circuit having both stages conducting the quiescent state is considered) must be of sufficient pulse duration to "turn-off" not only the input and output stages, but also, the duration must be sufficient so that a control signal from the output stage can keep the input stage "turned-off." It is apparent therefore, that each stage results in a delay which thereby necessitates an input trigger having a relatively long duration if the multivibrator is to generate an output pulse. By keeping the input stage transistor "turned-off" independently of the output stage transistor as in the circuit of the subject invention, the input stage can be speedily "turned-off" and remain off by direct feedback from its collector-to-emitter electrodes without a signal being applied from the output stage transistor. This single stage control does not require a long input signal and hence there is very satisfactory response to a narrow input signal.

If a monostable multivibrator employs a capacitor to determine its active time, i.e. the duration of the output pulse, it follows that such a circuit must provide an output pulse of a greater duration than an applied input pulse. If the foregoing were not true there would be no point in employing a capacitor to determine the output pulse. Rather it would be a simple matter of "turning-on" and "turning-off" a single transistor with an input pulse. In the prior art monostable multivibrator circuits the limitation on the narrowness of an output pulse is determined by the time it takes to activate the two stages and subsequently hold off the first stage as mentioned earlier. Since the present circuit is not limited by the two stage activition, it is responsive to a more narrow input pulse and hence, produces a narrow output pulse which the prior art circuits could not generate; but nonetheless an output pulse controlled by a charging capacitor circuit. Because of this increased sensitivity the present circuit can also produce a more narrow output pulse than the prior art circuits for the same given input pulse. By employing a capacitor in the input circuit such as capacitor 62, to differentiate or peak a long duration input signal, i.e. transform it into a narrow input pulse of such short duration that the prior art circuits would not be responsive thereto, an output pulse characterized by a shorter duration than would be possible with a prior art circuit is generated.

With the application of the trigger signal to input element 11, transistor 10 stops conducting and inductor 50, being reluctant to change its former stage of current conduction, acts as a current pump or current source and thereby provides a surge of current which is driven into the base 20 of the output transistor 12. The effect of this surge or "clean-up" current serves to neutralize stored minority carriers and thereby provides a fast fall time of the output signal. The "clean-up" current completes the circuit to ground through "speed-up' capacitor 36 which provides a low impedance path at the moment when the transistors 10 and 12 stop conducting. When transistors 10 and 12 are conducting, "speed-up" capacitor 36 becomes charged negatively with respect to ground, however, it assumes only a small charge because it is not only a relatively small capacitance, but also because of the small drop across 32 in the forward direction. This small charge is easily overcome by the "clean-up" current which flows from capacitor 26, through transistor 12 through capacitor 36 to ground. When the transistors 10 and 12 are turned off, the "clean-up" current charges capacitor 36 positively with respect to ground.

As soon as the output transistor 12 stops conducting, the leading edge of the output pulse is generated at terminal 13. The negative level of the output pulse is determined by the voltage level at the anode 61 of clamp diode 60. The width of the output pulse which occurs in response to the non-conducting period or the "turn-off" period of the transistors 10 and 12 is determined primarily by the capacitance 26 as well as by voltage sources 38 and 40, resistors 34, 42, 44, and the surge current provided by the inductance 50.

During this non-conduction period, charging current for capacitor 26 flows through diode 30 and resistor 34 to ground. This current is maximum when capacitor 26 is initially being charged and then gradually is reduced as it assumes its full charge. During the initial charging of the capacitor 26, the terminal 35 of resistor 34 is at a positive potential which provides reverse bias to emitter 18 thereby preventing transistor 10 from conducting. Furthermore, as long as current flows through diode 30, and the potential at 35 is more positive than 14 transistor 12 will be reverse biased and will remain cut-off. Since the voltage at the base 14 of transistor 10 is held nearly constant and slightly above ground by current flow through the steering diodes 54 and 56, or voltage divider, transistor 10 remains off as long as its emitter 18 is positive relative to the base 14 i.e. as long as a substantial amount of charging current (for capacitor 26) flows across resistor 34.

Subsequently, the current flow through diode 30 and resistor 34 resulting from the charging of capacitor 26 diminishes such that the potential at the terminal 35 of resistor 34 falls below the potential maintained at the base 14 such that the transistor 10 becomes forward biased and is "turned-on."

When transistor 10 is turned on, the potential of the collector 16 becomes the same as that of the emitter 18 and emitter 24. The negative potential developed across the charged capacitor 26 is then applied between base 20 and emitter 24 and causes the transistor 12 to become conductive. When transistor 12 becomes conductive the capacitor 26 quickly discharges through the low impedance path provided by transistors 10 and 12. Furthermore, because of the delaying action of inductance 50, a large part of the collector current necessary for the operation of transistor 10 is the discharge current of capacitor 26. The rapid current discharge through the low impedance path provided by transistors 10 and 12 materially enhances the switching speed of transistor 12 and the rise time of the output signal. This fast switching of transistor 12 is aided by the fact that current is rapidly driven out of the base electrode 20. Since the capacitor 26 is discharged rapidly the multivibrator is quickly restored to its original state wherein the transistors 10 and 12 are again conducting current and the circuit is ready for another input signal.

While it is understood that the circuit may vary according to the design for any particular application, the following circuit parameters are included by way of example. For this circuit design, the voltage applied to terminals 38, 40 and 68 are +15, −15, and −3 volts, respectively.

| | | |
|---|---|---|
| Resistor 34 | ohms | 33$k$ |
| Resistor 42 | do | 1$k$ |
| Resistor 44 | do | 3.3$k$ |
| Resistors 46 and 52 | do | 470 |
| Resistor 58 | do | 250 |
| Resistor 64 | do | 560 |
| Inductance 50 | microhenries | 2.2 |
| Capacitor 36 | microfarads | 25 |
| Capacitor 62 | do | 25 |
| Capacitor 66 | do | 25 |

The value of the capacitor 26 is determined by the output pulse width that is required and this is determined by design considerations.

With the transistors available at the present time, namely Motorola type 2N834 (NPN) and 2N828 (PNP), the rise and fall time of the output pulse are approximately 3 to 4 nanoseconds. Output pulse width may be from 20 nanoseconds to several microseconds. For a pulse width of 100 nanoseconds or more, the recovery time (that is, the time required between the end of the output pulse and the beginning of the next input pulse such that the output pulse width is constant) is about 50 nanoseconds. For shorter output pulses, the recovery time will be less. The recovery time is determined by the time it takes capacitor 26 to discharge. A trigger input signal of 4 volts and minimum duration of 15 nanoseconds is required to activate the multivibrator, if the foregoing circuit components are employed.

Since "clean" output pulses are obtained for "sloppy" input pulses, the circuit of the present invention can also be used as a pulse forming or pulse shaping device. It should be recognized that the use of the subject invention with high speed computers employing thin film memories, is only one possible application of such a circuit and it is not therefore limited thereto. Other known applications to which the instant invention might apply are in the related fields of frequency counting frequency dividing and synchronizing circuits, as well as to applications requiring high switching speeds which are obvious to those skilled in the art.

It should be understood that the opertion of the circuit of the present invention has been described with regard to semiconductor devices, namely transistors, however, the theory underlying this invention could readily be applied to any current conducting device.

In summary, high speed switching, in the nanosecond region, can be attained by the switching circuit which is the subject of this invention as a result of the following incorporated features: The feedback arrangement connected directly across the collector to emitter electrodes of the input transistor eliminates the unnecessary delays inherent in prior art circuits. This is accomplished by keeping the emitter electrode positive with respect to the base electrode thereby controlling the input transistor within its own stage and independently of the output transistor. This action results in materially improved circuit sensitivity so that narrow trigger input pulses will operate the multivibrator. Since the circuit of the subject invention has materially increased sensitivity it is able to generate narrow output pulses from long duraton input pulses.

Secondly, the ability of the circuit of the present invention to "turn-off" the output transistor, after the application of the input trigger signal, is greatly enhanced by utilizing an inductance connected to the collector of the first stage transistor and through a capacitance to the base element of the output transistor. This inductance serves as a current source when the first stage transistor is "turned-off" to drive "turn-off" current through the capacitor and into the base of the output transistor, thereby neutralizing the minority carriers in the output transistor and effecting a fast turn-off.

Further, this inductance element also is a component which together with diode 48, and resistors 52 and 64 are connected across the collector and the base of the input stage transistor and serve the function of biasing the input transistor in the non-saturated state.

Thirdly, at a time determined by circuit parameters and when the output transistor is conducting and completing the output cycle, the last-mentioned capacitor quickly discharges through the low impedance path provided by the conducting input and output transistors. This circuit action has the effect of pulling a relatively large base current for the output transistor, thereby quickly causing the output stage transistor to go to full conduction.

Obviously many modifications and variations of the present invention are possible in the light of the above teachings. It is therefore to be understood that within the scope of the appended claims, the invention may be practiced otherwise than as specifically described.

The embodiments of the invention in which an exclusive property or privilege is claimed are defined as follows:

1. A switching circuit comprising:

(a) first and second semiconductor devices each having base, emitter, and collector electrodes, said collector electrode of said first semiconductor device adapted to be connected to a first source of potential and said collector electrode of said second semiconductor device adapted to be connected to a second source of potential;

(b) signal storage means having first and second terminals, said first terminal connected to said collector of said first semiconductor device, said second terminal connected to said base of said second semiconductor device as well as to said second source of potential, a first charging path being formed from said first source of potential to said second source of potential via said signal storage means;

(c) connecting means joining said emitter electrode of said first semiconductor device to said emitter electrode of said second semiconductor device, current being conducted in the quiescent state from said first source of potential to said second source of potential via said collector and emitter electrodes of said first semiconductor device, said emitter and collector electrodes of said second semiconductor device and said connecting means;

(d) input means connected to said base electrode of said first semiconductor device and adapted to receive an input signal, such input signal rendering said first and second semiconductor devices non-conductive and causing said signal storage means to become charged through said first charging path;

(e) means connected to said second terminal of said signal storage means and to said connecting means thus providing a direct coupling path from said collector electrode to said emitter electrode of said first semiconductor device and further providing a second charging path for said signal storage means to control the turn-off of said first semiconductor device for a period of time independently of the turn-off of said semiconductor device after said input signal has been received by said input means.

2. A monostable multivibrator circuit comprising:

(a) first and second semiconductor devices each having base, emitter, and collector electrodes, said collector electrode of said first semiconductor device adapted to be connected to a first source of potential and said collector electrode of said second semiconductor device adapted to be connected to a second source of potential;

(b) capacitor means having first and second terminals, said first terminal connected to said collector electrode of said first semiconductor device, said second terminal connected to said base electrode of said second semiconductor device as well as to said second source of potential, a first charging path being formed from said first source of potential to said second source of potential via said capacitor means;

(c) connecting means joining said emitter electrode of said first semiconductor device to said emitter electrode of said second semiconductor device, current being conducted in the quiescent state from said first source of potential to said second source of potential by way of said collector and emitter electrodes of said first semiconductor device, said emitter and collector electrodes of said second semiconductor device and said connecting means;

(d) input means connected to said base electrode of said first semiconductor device and adapted to receive an input signal, such input signal rendering said first and second semiconductor devices non-conductive and causing said capacitor means to become charged through said first charging path;

(e) unilateral conducting means connected to the second terminal of said capacitor means and to said connecting means thus providing a coupling path from said collector to said emitter of said first semiconductor device and further providing a second charging path for said capacitor means to control the turn-off of said first semiconductor device for a period of time independently of the turn-off of said second semiconductor device after said input signal has been received by said input means.

3. A switching circuit comprising:

(a) first and second current conducting devices each having input, output and control elements, said input element of said first current conducting device adapted to be connected to a first source of potential and said output element of said second current conducting device adapted to be connected to a second source of potential;

(b) signal storage means having first and second terminals, said first terminal connected to said input element of said first current conducting device, said second terminal connected to said control element of said second current conducting device as well as to said second source of potential, a first charging path being formed from said first source of potential to said second source of potential via said signal storage means;

(c) connecting means joining said output element of said first current conducting device to said input element of said second current conducting device, current being conducted in the quiescent state from said first source of potential to said second source of potential via said input and output elements of said first and second current conducting devices, respectively, and said connecting means;

(d) current source means having first and second terminals, said first terminal being connected to said first terminal of said signal storage means and said second terminal of said current source means being connected by means of a resistance to said first potential source;

(e) input means connected to said control element of said first current conducting device and adapted to receive an input signal, such input signal rendering said first and second current conducting devices nonconductive and causing said signal storage means to become charged through said first charging path, said current source means causing current to be conducted into said control element of said second current conducting device to provide rapid turn-off thereof;

(f) means connected to said second terminal of said signal storage means and to said connecting means thus providing a coupling path from said output element to said input element of said first current conducting device and further providing a second charging path for said signal storage means to control the turn-off of said first current conducting device for a period of time independently of the turn-off of second current conducting device after said input signal has been received by said input means.

4. A switching circuit comprising:

(a) first and second semiconductor devices each having emitter, base, and collector electrodes, said collector electrode of said first semiconductor device adapted to be connected to a first source of potential and said collector electrode of said second semiconductor device adapted to be connected to a second source of potential;

(b) capacitor means having first and second terminals, said first terminal connected to said collector electrode of said first semiconductor device and said second terminal connected to said base electrode of said second semiconductor device as well as to said second source of potential, a first charging path being formed from said first source of potential to said second source of potential via said capacitor means;

(c) connecting means joining said emitter electrode of said first semiconductor device to said emitter electrode of said second semiconductor device current being conducted from said first source of potential to said second source of potential by way of said first and second semiconductor devices and said connecting means;

(d) inductance means having first and second terminals, said first terminal being connected to said first terminal of said capacitor means and said second terminal of said inductance means being connected by means of a resistance to said first source of potential;

(e) input means connected to said base electrode of said first semiconductor device and adapted to receive an input signal, such input signal rendering said first and second semiconductor devices non-conductive and causing said capacitor means to become charged through said first charging path;

(f) means comprising a unilateral conducting means having first and second terminals and a resistor having first and second terminals, said first terminal of said unilateral conducting means connected to said second terminal of said capacitor means and said second terminal of said unilateral conducting means being connected to said connecting means, said first terminal of said resistor connected to said connecting means and said second terminal of said resistor connected to a third source of electrical potential to form a second charging path for said capacitor means to control the turn-off of said first semiconductor device for a period of time independently of the turn-off of said second semiconductor device after said input signal has been received by said input means.

5. A switching circuit comprising:

(a) first and second current conducting devices each having input, output and control elements, said input element of said first current conducting device adapted to be connected to a first source of potential and said output element of said second current conducting device adapted to be connected to a second source of potential;

(b) a voltage storage means having first and second terminals, said first terminal connected to the input element of said first current conducting device, said second terminal connected to the control element of said second current conducting device as well as to said second source of potential;

(c) connecting means joining said output element of said first current conducting device to said input element of said second current conducting device, current being conducted in the quiescent state from said first source of potential to said second source of potential via said input and output elements of said first current conducting device, said connecting means, and said input and output elements of said second current conducting device;

(d) a third source of potential, which is common connected to said first and second sources of potential and which is more negative than said first source of potential and more positive than said second source of potential, connected to said connecting means;

(e) input means connected to said control element of said first current conducting device and adapted to receive an input signal of relatively short duration, such input signal rendering said first and second current conducting devices non-conductive;

(f) low impedance means connected to the second terminal of said voltage storage means and to said connecting means thus providing a charge path for said voltage storage means to control the turn-off of said first current conducting device for a period of time independently of the turn-off of said second current conducting device after said input means has received an input signal.

6. A switching circuit comprising:

(a) first and second current conducting devices each having input, output and control elements, said input element of said first current conducting device adapted to be connected to a first source of potential which has a ground return path and said output element of said second current conducting device adapted to be connected to a second source of potential which has a ground return path;

(b) voltage storage means having first and second terminals, said first terminal connected to the input element of said first current conducting device, said second terminal connected to the control element of said second current conducting device as well as to said second source of potential, a first charging path being formed from said first source of potential to said second source of potential via said voltage storage means;

(c) connecting means joining said output element of said first current conducting device to said input element of said second current conducting device, current being conducted in the quiescent state from said first source of potential to said second source of potential via said input and output elements of said first current conducting device, said connecting means and said input and output elements of said second current conducting device, said connecting means adapted to be connected to ground;

(d) input means connected to said control element of said first current conducting device and adapted to receive an input signal of relatively short duration;

(e) low impedance means connected to the second terminal of said voltage storage means and to said connecting means thus providing a second charging path for said voltage storage means to control the current non-conduction of said first current conducting device for a period of time determined by the amount of charge received by said voltage storage means when current is conducted through said second charging path to ground, after said input means has received an input signal.

7. A switching circuit comprising:

(a) first and second semiconductor devices each having emitter, base and collector electrodes, said collector electrode of said first semiconductor device adapted to be connected to a first source of potential and said collector electrode of said second semiconductor device adapted to be connected to a second source of potential;

(b) capacitor means having first and second terminals, said first terminal connected to the collector of said first semiconductor device and said second terminal connected to the base of said second semiconductor device as well as to said second potential source, a first charging path being formed from said first source of potential to said second source of potential via said capacitor means;

(c) connecting means joining said emitter of said first semiconductor device to said emitter of said second semiconductor device, current being conducted in the quiescent state from said first source of potential to said second source of potential via said emitters and collectors of said first and second semiconductor devices, respectively, and said connecting means;

(d) inductance means having first and second terminals, said first terminal of said inductance means being connected to said first terminal of said capacitor means and said second terminal of said inductance means being connected by means of a resistance to said first source of potential, current being conducted in the quiescent state from said first source of potential through said collector and emitter of said first semiconductor device via said inductance and resistance;

(e) input means connected to said base electrode of said first semiconductor device and adapted to receive an input signal, such input signal rendering said first and second semiconductor devices nonconductive and causing said capacitor means to become charged through said first charging path and causing said inductance means to conduct current into said base electrode of said second semiconductor device to cause the latter to turn-off rapidly;

(f) means comprising both a unilateral conducting device having first and second terminals, said first terminal of said unilateral device connected to said second terminal of said capacitor means and said second terminal of said unilateral device connected to said connecting means, and a resistor having first and second terminals wherein said first terminal of said resistor is connected to said connecting means and the second terminal of said resistor is connected to gound potential, said unilateral conducting device and said resistor in series connection providing a second charge path for said capacitor means to control the turn-off of said first semiconductor device for a period of time independently of the turn-off of said second current conducting device after said input signal has been received by said input means, said first semiconducor device remaining off until said capacitor means is charged after which said first and second semiconductor devices are rapidly turned-on by discharging said capacitor means through a low impedance path comprising said collector and emitter electrodes of said first semiconductor device as well as through said emitter and base electrode of said latter device.

References Cited by the Examiner

UNITED STATES PATENTS 3,095,510 6/63 Lane ---------------- 307—88.5

DAVID J. GALVIN, *Primary Examiner.*

JAMES D. KALLAM, *Examiner.*